United States Patent [19]

Allford

[11] Patent Number: 5,090,322

[45] Date of Patent: Feb. 25, 1992

[54] PYROTECHNIC TRAIN

[75] Inventor: Frederick G. Allford, Kent, England

[73] Assignee: The Secretary of State of Defence in Her Britannic Majesty's Government of the United Kingdom of Great Britian and Northern Ireland, London, England

[21] Appl. No.: 68,675

[22] Filed: Jun. 22, 1987

[30] Foreign Application Priority Data

Jun. 25, 1986 [GB] United Kingdom ............... 8615457

[51] Int. Cl.$^5$ .............................................. F42B 3/18
[52] U.S. Cl. ................................. 102/202.7; 156/634; 156/82; 149/15; 102/202.5
[58] Field of Search ................. 149/14, 15; 102/202.5, 102/202.7; 156/634, 82

[56] References Cited

U.S. PATENT DOCUMENTS

| | | | |
|---|---|---|---|
| 3,669,022 | 6/1972 | Dahn et al. ...................... | 102/202.5 |
| 3,765,334 | 10/1973 | Rentz et al. .................... | 102/202.5 X |
| 4,050,347 | 9/1977 | Adelman et al. ................. | 149/15 X |
| 4,256,038 | 3/1981 | Dietz et al. ..................... | 102/202.7 X |
| 4,409,898 | 10/1983 | Blix et al. ....................... | 102/202.5 |
| 4,576,094 | 3/1986 | Meador ......................... | 102/202.7 X |
| 4,708,060 | 11/1987 | Bickes, Jr. et al. ............... | 102/202.7 |
| 4,729,315 | 3/1988 | Proffit et al. .................... | 102/202.5 X |

Primary Examiner—Peter A. Nelson
Attorney, Agent, or Firm—Nixon & Vanderhye

[57] ABSTRACT

A micro pyrotechnic train is formed from a reactive laminate comprised by a plurality of thin films of an electron acceptor material (9) and an electron donor material (10) alternately layered upon a substrate layer by vacuum deposition. The thus deposited films are then removed from selected areas by etching, using standard printed circuit board techniques, to leave a desired network of reaction progression paths (2). The thickness of the films is of substantially molecular order to maximize molecular intermingling between them, and the number of films is selected to ensure a reliable burning characteristic. Ignition of the conjoint films at any selected location initiates a self-sustaining exothermic reaction which progresses laterally along the film interfaces.

In further aspects the reactive laminate is applicable as an infra-red emitting coating and as a flash transmitter. It is also applicable as a bridge igniter, the laminate being employed as an electrode bridge in place of a conventional exploding bridge wire.

10 Claims, 2 Drawing Sheets

PYROTECHNIC TRAIN

This invention relates to a pyrotechnic train, in particular but not exclusively, suitable for use in single or multi-train delay systems. It is also applicable to bridge-wire detonators and may be further adapted to provide infra-red radiation emitting coatings for decoy systems.

Multi-train pyrotechnic delay systems are known for initiating complex sequences of events, in a missile for example. These delay systems are normally constructed from known delay cords comprising lead tubes which are first packed with a prepared granular pyrotechnic composition, consisting of materials which are selected, prepared and mixed in specific ratios to achieve desired burning rates. The packed tubes are then fine drawn, cut to length, shaped and manually assembled with appropriate coupling components. The whole process is lengthy and operator dependant, has high tooling costs, requires clean room assembly and can be hazardous. The resulting multi-train is also disadvantageous in having a number of undesirable interfaces and inconsistent burning times. Furthermore there are problems attendant upon the use of such multi-train systems within an enclosed capsule in that the lead casing, which melts during burning, becomes spattered around possibly damaging other items in the capsule, such as plastics material casings. Also, the pressure of the gases generated during burning by the fairly large volume of pyrotechnic composition can be embarassingly high especially when the capsule is used at very low ambient pressure.

The present invention seeks to overcome these difficulties by providing a pyrotechnic train capable of having greater precision and greater inherent strength than that achievable with granular compositions, and having a production method amenable to automation.

Further, in a first aspect of the invention, the invention seeks to provide a fully sealable delay train.

In a second aspect, the invention seeks to provide an exposable pyrotechnic train which, when ignited, will radiate a pre-determined spectrum of wavelengths, and in a third aspect the invention seeks to provide a bridge ignitor having a reaction time comparable with that of an exploding bridgewire, but having greater reliability.

In accordance with the present invention, a pyrotechnic train includes a reactive laminate comprised by a substrate layer of an electron acceptor material having vapour-deposited thereon a film of an electron donor material, the said two materials being conjointly capable of exothermic reaction when subjected to heat.

The laminate may additionally include a further plurality of films of the two said materials, each one vapour-deposited upon the previously deposited film in alternating sequence.

Preferably, each film is sequentially deposited by vacuum deposition or by sputtering, the deposition process being controlled to ensure that the thickness of each film is of substantially molecular order so as to maximise molecular intermingling of the film materials throughout the thickness of the laminate.

Ignition of the conjoint electron donor and electron acceptor films at any selected location initiates a self-sustaining, exothermic reaction between the molecules which progresses laterally along the film interfaces. The number and thickness of the films is selected to be sufficient to ensure a reliable and consistent lateral progression characteristic.

The reactive laminate may further include one or more films of a moderating material selectively interlayered with the said reactive films during the deposition process so as to moderate the lateral progression characteristic, thereby to achieve a desired burning rate. The moderating material may also be selected to inject desired frequencies into the resulting radiation spectrum.

In the first aspect of the invention, i.e. a sealable delay train, the substrate layer may be supported upon a support member of inert material, preferably a poor thermal conductor so as to minimise diminution of the exothermic reaction, and may conveniently be a glass, ceramic or plastics material. If however, further moderation or variation of the progression characteristic is desired the thermal conductivity of the support member may be appropriately selected. When a support member is used, the substrate layer may itself be vapour-deposited thereon.

Alternatively the substrate layer may itself be of sufficient strength to support the laminate and of sufficient thickness to maintain its integrity in use, the reaction proceeding only at its interface surface. A convenient material for this purpose is a polytetrafluoroethylene (ptfe), such material having all the necessary requirements for carrying out the invention, i.e. it acts as an electron acceptor, has high mechanical strength and low thermal conductivity, and can be vapour-deposited. In a preferred arrangement magnesium is used as the electron donor material in conjunction with a ptfe acceptor material, but any other suitable metal/halide reaction materials could be used.

In the second and third aspects of the invention, ie a radiation emitter and a bridge igniter, the substrate layer need not retain its integrity and may be thin enough to be entirely consumed by the exothermic reaction of the reactive laminate.

The lateral dimensions of the reactive laminate are selected to define the width and length of a desired reaction progression path. These may be determined by the configuration of the support member or the substrate layer itself, e.g. a tubular path resulting from deposition upon a glass or ptfe fibre. Alternatively the films may be deposited upon one whole surface of a planar substrate layer and subsequently processed by known printed circuit techniques, to produce any desired planar configuration of progression path. In a further alternative method, the planar substrate layer may be masked prior to deposition so as to permit deposition of the reactive films upon the substrate layer in the desired configuration only.

Either of these latter two planar methods is particularly advantageous for the manufacture of complex multi-train systems, as the integral deposition of all the progression paths of the system thus made possible eliminates the need for undesirable interconnections.

A planar arrangement is also to be preferred in the first aspect of the invention when sealed confinement of the progression paths is required, an overlaid cover of ptfe or of an inert material, preferably of low thermal conductivity, being readily sealable to the substrate layer or support member. Such confinement acts both to contain the reaction and to control the pressure of the reaction and hence the burning rate. Consequently the closeness of confinement may be varied to provide further control of the progression characteristic.

In the third aspect of the invention, ie a bridge ignitor, the reactive laminate is used to provide a brisant reaction progression path between two electrodes adjacent a detonating charge, the laminate being vapour-deposited directly upon a conventional insulating support for the electrodes.

BRIEF DESCRIPTION OF THE DRAWINGS

Embodiments of the invention and methods of manufacture will now be described by way of example only, with reference to the accompanying drawings of which

Figure 1:
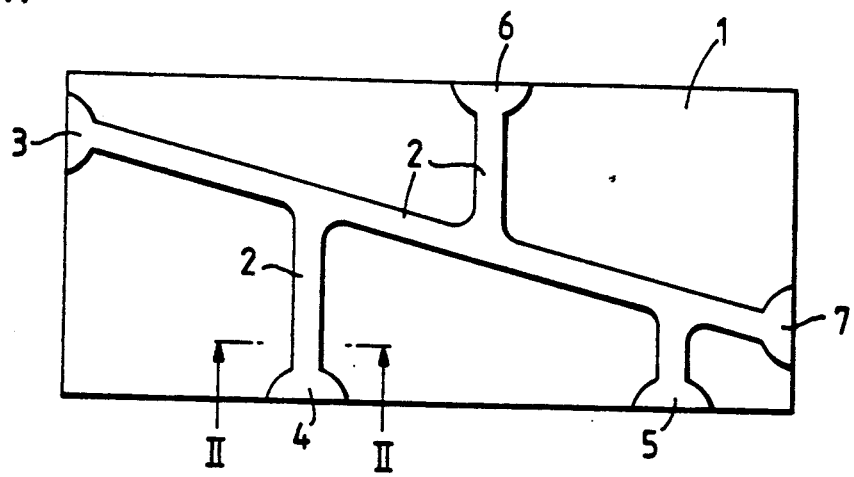
FIG. 1 is a plan view of a sealed planar pyrotechnic multi-train.
Figure 2:
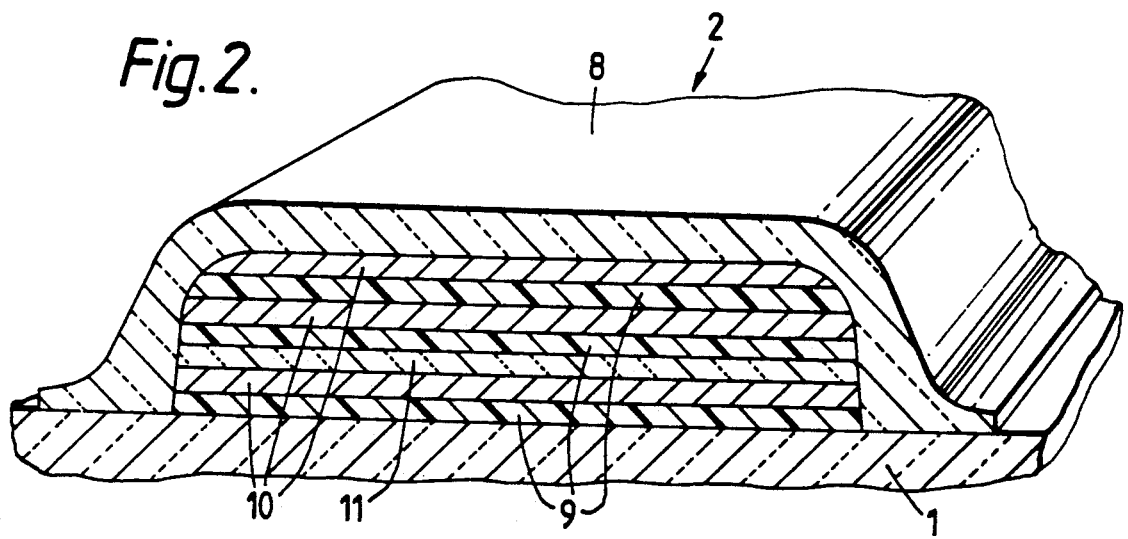
FIG. 2 is a sectioned elevation taken on the line II—II of FIG. 1.

The pyrotechnic multi-train illustrated in FIGS. 1 and 2 comprises a ceramic support plate 1 upon which is superimposed a network of reactive laminate progression paths 2 variously interconnecting and extending into edge terminals 3 to 7. The network of paths 2 is overlaid by a correspondingly configured cover 8 of ceramic which is peripherally sealed to the support plate 1, except at the terminals 3 to 7.

Each path 2 comprises a stack of alternately deposited co-reactive films 9 and 10, and has one interleaved moderating film 11. The films 9 and 10 are respectively of electron acceptor and electron donor materials, those used in the present example being ptfe for films 9 (the lowermost film 9 comprising the aforesaid substrate layer) and magnesium for films 10. Film 11 is optional and may be of an inert material such as silicon.

Many other deposition materials are appropriate for the reactive films, one further example being lead oxide for the acceptor films 9 and titanium for the donor films 10.

The paths 2 are formed upon the plate 1 in a method of manufacture now to be described.

One whole face of the support plate 1 is first suitably prepared and then completely coated with the films 9, 10 and 11 in appropriate sequence using conventional vacuum deposition equipment (not shown). The deposition source materials, e.g. ptfe, magnesium and silicon, are each located in separate vaporising boats and vaporised in turn by electron beam in an atmosphere of argon.

To ensure a reliable reaction progression characteristic the thickness of each deposited film 9, 10 and 11 is preferably no greater than 2 $\mu$m, films of greater thickness being undesirable as their heat of absorption may be sufficient to destroy the exothermic nature of the interlayer reaction. The total number of reactive films 9 and 10 required is dependent upon the thickness and the thermal conductivity of the support plate, ie upon its effectiveness as a heat sink. Using an alumina support plate of 1 mm thickness having a thermal conductivity of 17 W/m, a deposition of 100 films 9 and 100 films 10, each of 0.5 $\mu$m thickness, has been found effective. (Only a few films are illustrated in the drawings in the interest of clarity). Less films are needed if a ptfe support plate is used as it will itself contribute to the reaction and thus compensate for heat loss.

The thus deposited films 9, 10 and 11 each have a columnar crystal lattice structure which is intermolecularly engaged with each next adjacent lattice providing a reactive laminate which once ignited will sustain an inter-lattice exothermic reaction.

After completion of the deposition process, the required areas of the deposited laminate, ie the network of paths 2, are masked with an acid resistant coating (not shown) and the remaining areas of the films removed by acid etching in the manner of known printed circuit board production techniques. The plate 8 is then superimposed and edge-sealed to the support plate 1, by means of a compatible sealant (not shown).

It will be apparent to those skilled in the art that a similar network of paths 2 can be alternatively achieved by masking the support plate prior to deposition of the films 9, 10 and 11.

In use, the progression path network is ignited electrically, or by friction or by a heat donor source at a selected one of the terminals, terminal 3 for example, and the resulting exothermic reaction progresses along the paths 2 at uniform rate to provide an ignition source at each of the remaining terminals 4 to 7 at intervals precisely determined by the lengths of the intervening paths. In application, all or any of the terminals 4 to 7 may be used to initiate other ongoing delays or terminal events.

A further alternative method of manufacture requires the use of a photo sensitive glass for the support plate 1, of a type well known for printed circuit production, which is rendered less resistant to exposure to ultra-violet radiation. The plate 1 of this material can be first masked with the desired configuration of progression paths, exposed to ultra-violet radiation, and then etched so as to form a pierced template of the path network, which template is subsequently subjected to vacuum deposition of the reactive laminate as previously described. Sealing of the progression paths manufactured in this manner may be achieved by encapsulating the coated template between the cover 8 and a supplementary base plate (not shown).

Figure 3:
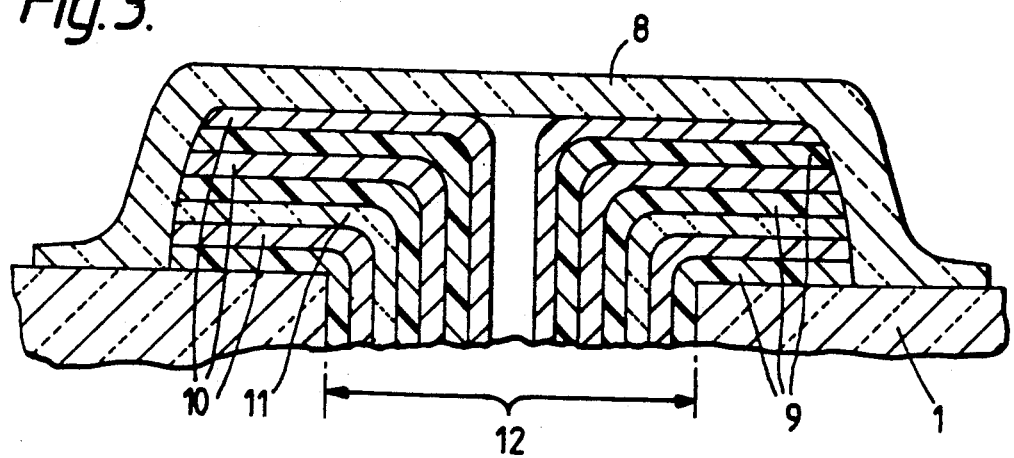
FIG. 3 is a sectioned elevation of an alternative terminal arrangement for the multi-train of FIG. 1.

An alternative terminal arrangement is illustrated in FIG. 3 for use when access to the multi-train is required through the thickness of the plate 1. In this arrangement, suitably shaped holes 12 are provided in the plate 1 before the commencement of the deposition process, the edges of which holes become coated with the reactive laminate during subsequent deposition in common with the planar surface of the plate.

It will be apparent to those skilled in the art that other, more complex delay train networks can be produced in accordance with the invention. For example, specialised event initiators can be formed integrally with the paths at selected terminals during manufacture. In addition, alternative routes can be built into any particular multitrain so as to permit selection of delay times.

This first aspect of the invention is also applicable to the manufacture of track plates for the provision of multiple simultaneous ignition for the initiation of explosive or pyrotechnic devices in a wide variety of geometric configurations.

The vapour deposited reactive laminate of the invention is inherently stronger than granular pyrotechnic compositions and is therefore advantageous in use in the second aspect of the invention, in that no protective external covering is required. In this aspect the reactive and moderating materials employed in the laminate can be selected to provide a heat output train having a specific radiation spectrum. A further advantage lies in the wide choice of materials that can be readily vapour deposited thus permitting provision of a comprehensive range of wavelengths in the radiation spectrum.

Figure 4:
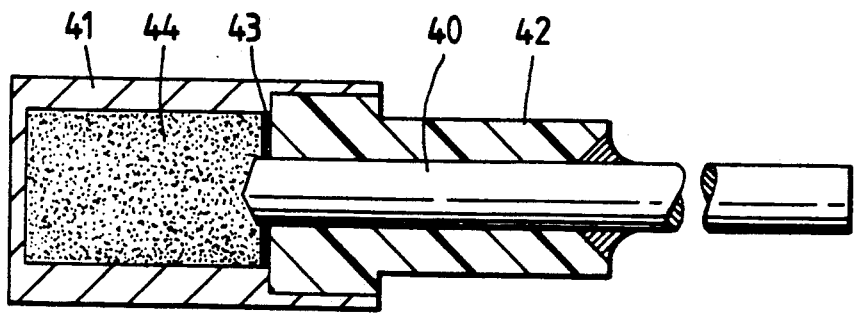
FIG. 4 is an axially sectioned view of a bridge ignitor.

In its third aspect, the invention provides a ready means of fabricating electrically sensitive detonators and igniferous initiators. A conventional cylindrical arrangement is illustrated in FIG. 4, in which a first electrode in the form of a pin 40 is held coaxially within a cylindrical second electrode 41 by means of an insulating bush 42, the reactive laminate 43 being deposited directly onto the annular end face of the bush adjacent a detonator charge 44, thereby providing a reliable multi-radial reaction progression path between the two electrodes capable of violent reaction at relatively low voltage. Such arrangements can also be used as an ignitor, merely by reducing the voltage applied to the electrodes.

Another similar application of the invention is in the preparation of fast acting electrical cut-out fuses (not shown).

Figure 5:
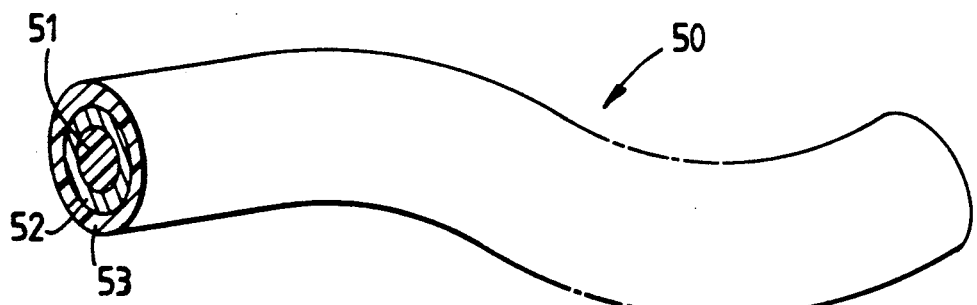
FIG. 5 is a perspective view of a length of flash transmitting cord.

A further application of the reactive laminate is illustrated in FIG. 5, which depicts a flash transmitting cord suitable for use as a cordite replacement. The cord 50 comprises an inner core 51 of ptfe upon which a coaxial annulus 52 of magnesium has been vacuum-deposited and subsequently encased by an outer sleeve 53 of ptfe. Ignition by direct heat or by impactive compression of one end of the cord 50 will transmit a rapidly progressing, self-supporting exothermic reaction along an infinite length of the cord.

Impact sensitivity of the cord may be increased by the inclusion of further coaxial annuli (not shown) of magnesium and ptfe in accordance with the invention.

I claim:

1. A pyrotechnic train including a reactive laminate comprised by a substrate layer of an electron acceptor material having vapour-deposited thereon a film of an electron donor material, the said two materials being conjointly capable of exothermic reaction when subjected to heat.

2. A pyrotechnic train as claimed in claim 1 including a further plurality of films of the two said materials, each one sequentially vapour-deposited upon the previously deposited film in alternating sequence.

3. A pyrotechnic train as claimed in claim 2 further including at least one interlayered film of a moderating material.

4. A pyrotechnic train as claimed in claim 2 wherein the thickness of each film is of substantially molecular order.

5. A pyrotechnic train as claimed in claim 1 wherein the electron acceptor material is polytetrafluoroethylene and the electron donor material is magnesium.

6. A pyrotechnic train as claimed in claim 2 wherein the electron donor material is lead oxide and the electron acceptor material is titanium.

7. A pyrotechnic train as claimed in claim 5 comprising a flash transmitting cord having an annulus of vapour-deposited magnesium extending coaxially between an inner core and an outer sleeve, both of polytetrafluoroethylene.

8. A pyrotechnic train as claimed in claim 1 arranged as a bridge between two electrodes located adjacent a detonator charge.

9. A method of manufacture for a pyrotechnic train as claimed in claim 1 wherein a desired configuration of reaction progression paths is provided by the removal of unwanted regions of the deposited film from the substrate layer by a process of selective etching.

10. A method of manufacture for a pyrotechnic train as claimed in claim 1 wherein the substrate layer is selectively masked prior to deposition so as to deposit the film in a desired configuration of reaction progression paths.

* * * * *